United States Patent
Frank et al.

(10) Patent No.: US 7,718,496 B2
(45) Date of Patent: May 18, 2010

(54) TECHNIQUES FOR ENABLING MULTIPLE $V_t$ DEVICES USING HIGH-K METAL GATE STACKS

(75) Inventors: Martin M. Frank, Dobbs Ferry, NY (US); Arvind Kumar, Chappaqua, NY (US); Vijay Narayanan, New York, NY (US); Vamsi K. Paruchuri, Albany, NY (US); Jeffrey Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 217 days.

(21) Appl. No.: 11/927,964

(22) Filed: Oct. 30, 2007

(65) Prior Publication Data

US 2009/0108373 A1    Apr. 30, 2009

(51) Int. Cl.
 H01L 21/8234 (2006.01)
 H01L 21/8244 (2006.01)
(52) U.S. Cl. .................. 438/275; 438/595; 257/E21.64
(58) Field of Classification Search ................. 438/154, 438/199, 200, 218, 221, 230, 265, 275, 276, 438/296, 303, 424, 587, 595; 257/E21.532, 257/E21.54, E21.545, E21.546, E21.661, 257/E21.626, E21.64
See application file for complete search history.

(56) References Cited

U.S. PATENT DOCUMENTS

| | | | | |
|---|---|---|---|---|
| 5,320,975 A * | 6/1994 | Cederbaum et al. | ......... | 438/153 |
| 5,712,201 A * | 1/1998 | Lee et al. | ..................... | 438/239 |
| 6,259,126 B1 * | 7/2001 | Hsu et al. | ................... | 257/298 |
| 6,492,690 B2 * | 12/2002 | Ueno et al. | ................. | 257/392 |
| 6,586,807 B2 * | 7/2003 | Nishida et al. | .............. | 257/401 |
| 6,699,756 B1 * | 3/2004 | Hsiao | ......................... | 438/259 |
| 6,815,282 B2 * | 11/2004 | Dachtera et al. | ............ | 438/204 |
| 6,894,356 B2 * | 5/2005 | Choi | .......................... | 257/393 |
| 7,109,076 B2 * | 9/2006 | Sakai et al. | ................. | 438/197 |
| 7,274,072 B2 * | 9/2007 | Chang et al. | ................ | 257/368 |
| 7,329,923 B2 * | 2/2008 | Doris et al. | ................. | 257/347 |
| 7,342,287 B2 * | 3/2008 | Chuang et al. | ............. | 257/392 |
| 7,388,238 B2 * | 6/2008 | Osada et al. | ................ | 257/204 |
| 7,388,267 B1 * | 6/2008 | Chen et al. | .................. | 257/418 |
| 7,432,567 B2 * | 10/2008 | Doris et al. | ................. | 257/407 |
| 7,471,548 B2 * | 12/2008 | Baiocco et al. | ............. | 365/156 |
| 7,479,683 B2 * | 1/2009 | Bojarczuk et al. | ........... | 257/410 |
| 7,521,765 B2 * | 4/2009 | Tsutsumi et al. | ............ | 257/392 |
| 7,569,466 B2 * | 8/2009 | Callegari et al. | ............ | 438/592 |

(Continued)

Primary Examiner—W. David Coleman
Assistant Examiner—Maliheh Malek
(74) Attorney, Agent, or Firm—Vazken Alexanian; Michael J. Chang, LLC

(57) ABSTRACT

Techniques for combining transistors having different threshold voltage requirements from one another are provided. In one aspect, a semiconductor device comprises a substrate having a first and a second nFET region, and a first and a second pFET region; a logic nFET on the substrate over the first nFET region; a logic pFET on the substrate over the first pFET region; a SRAM nFET on the substrate over the second nFET region; and a SRAM pFET on the substrate over the second pFET region, each comprising a gate stack having a metal layer over a high-K layer. The logic nFET gate stack further comprises a capping layer separating the metal layer from the high-K layer, wherein the capping layer is further configured to shift a threshold voltage of the logic nFET relative to a threshold voltage of one or more of the logic pFET, SRAM nFET and SRAM pFET.

5 Claims, 12 Drawing Sheets

U.S. PATENT DOCUMENTS

| | | | |
|---|---|---|---|
| 7,605,429 B2* | 10/2009 | Bernstein et al. | 257/347 |
| 2002/0094616 A1* | 7/2002 | Hsiao | 438/163 |
| 2005/0073061 A1* | 4/2005 | Lee | 257/903 |
| 2005/0098839 A1* | 5/2005 | Lee et al. | 257/410 |
| 2005/0168895 A1* | 8/2005 | Akiyama | 361/56 |
| 2006/0099765 A1* | 5/2006 | Yang | 438/301 |
| 2006/0231899 A1* | 10/2006 | Chang et al. | 257/368 |
| 2006/0244035 A1* | 11/2006 | Bojarczuk et al. | 257/314 |
| 2006/0246647 A1* | 11/2006 | Visokay et al. | 438/199 |
| 2006/0275969 A1* | 12/2006 | Sakai et al. | 438/197 |
| 2006/0289948 A1* | 12/2006 | Brown et al. | 257/410 |
| 2007/0018253 A1* | 1/2007 | Liaw | 257/369 |
| 2007/0085151 A1* | 4/2007 | Kotani | 257/393 |
| 2007/0187769 A1* | 8/2007 | Anderson et al. | 257/369 |
| 2008/0142895 A1* | 6/2008 | Baiocco et al. | 257/369 |
| 2009/0014798 A1* | 1/2009 | Zhu et al. | 257/351 |
| 2009/0108373 A1* | 4/2009 | Frank et al. | 257/392 |
| 2009/0174010 A1* | 7/2009 | Yang et al. | 257/407 |
| 2009/0224332 A1* | 9/2009 | Tsutsumi et al. | 257/392 |

* cited by examiner

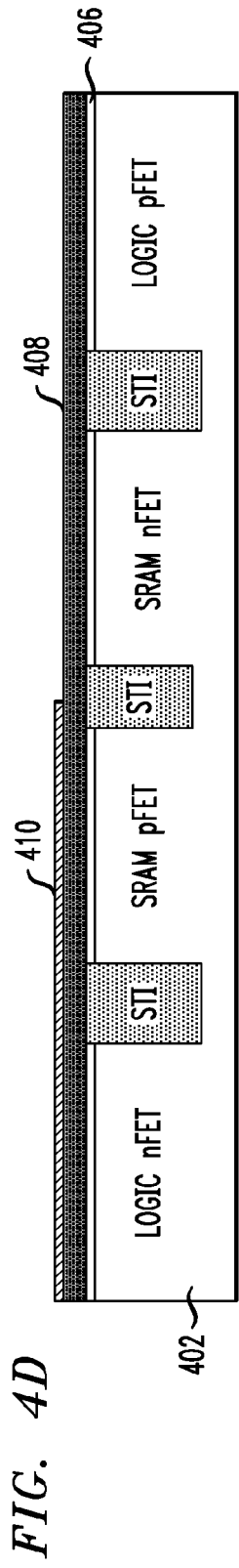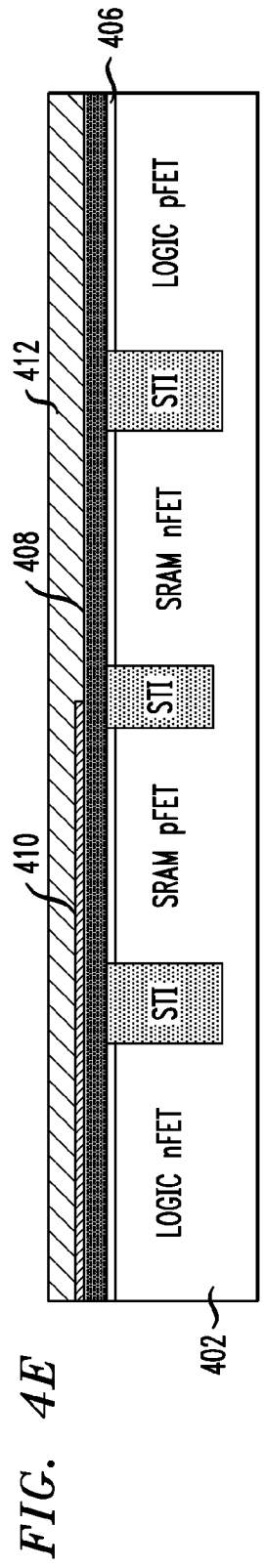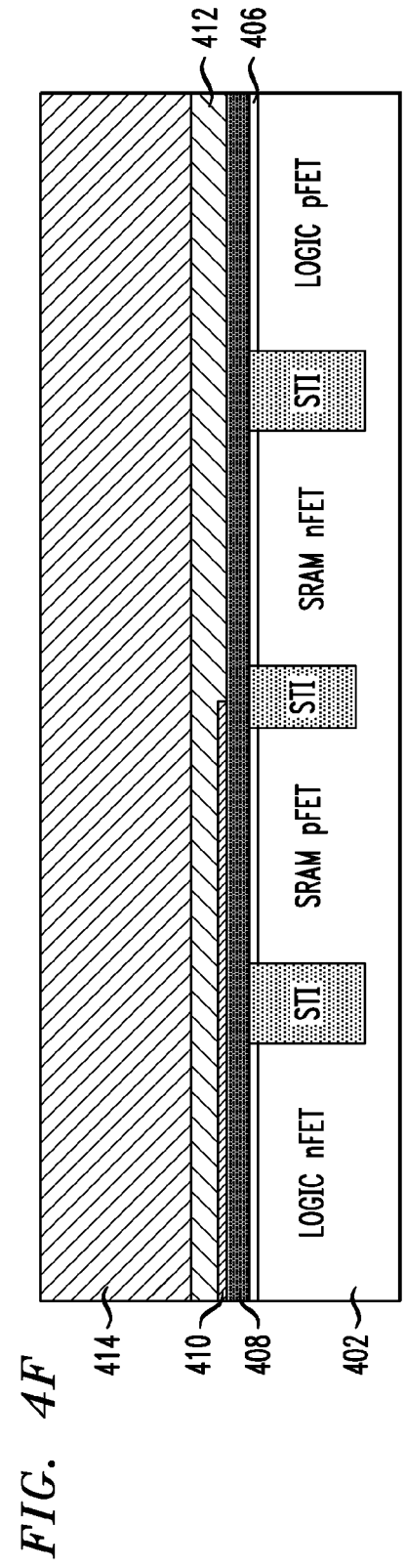

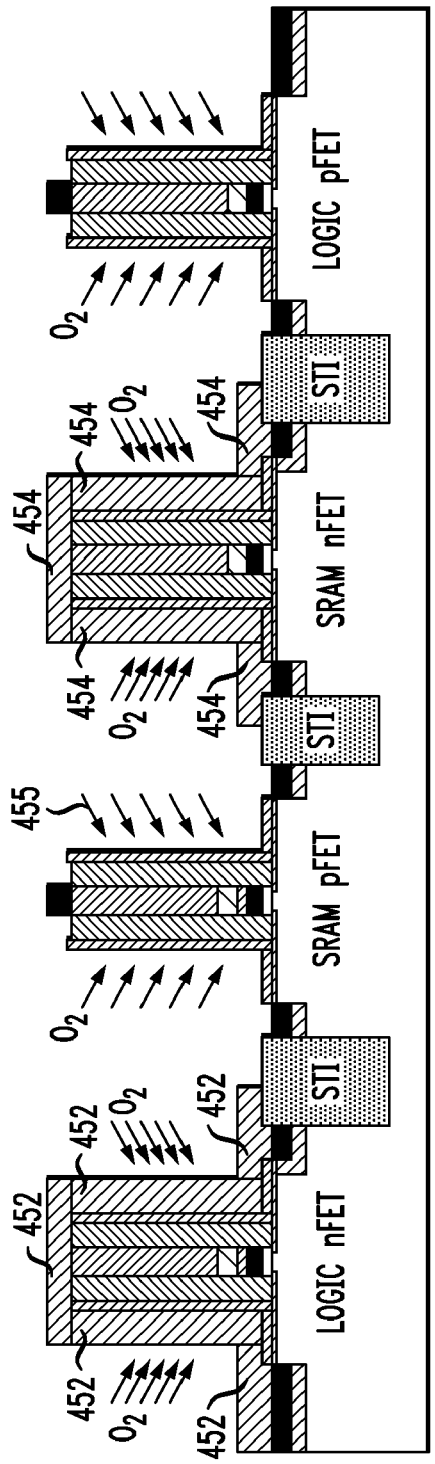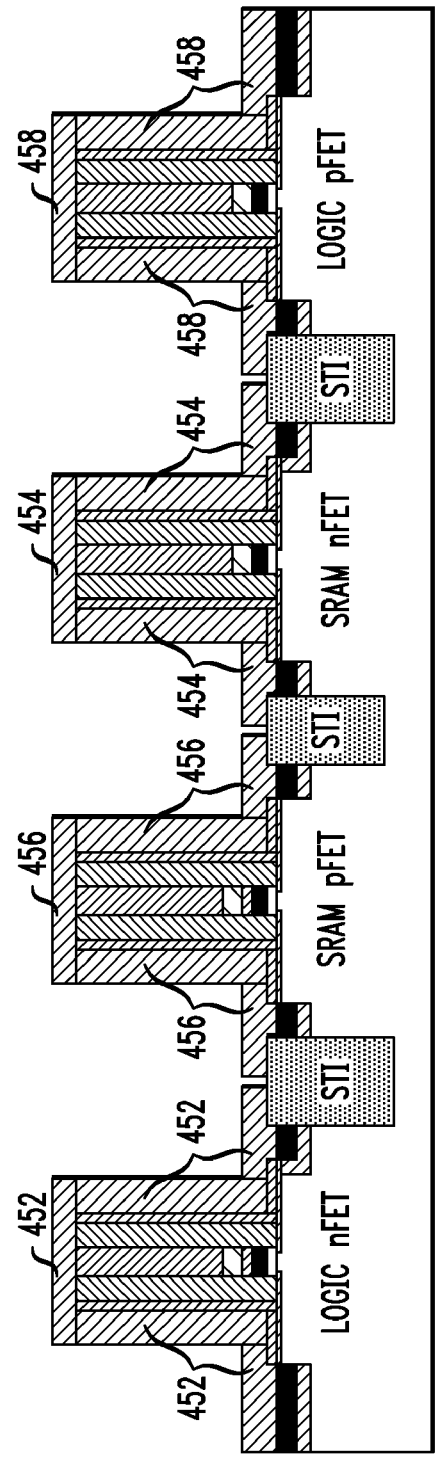

500

TECHNIQUES FOR ENABLING MULTIPLE V$_t$ DEVICES USING HIGH-K METAL GATE STACKS

FIELD OF THE INVENTION

The present invention relates to integrated circuits, and more particularly, to techniques for combining transistors in an integrated circuit having different threshold voltage requirements from one another.

BACKGROUND OF THE INVENTION

Integrated circuits now commonly include a wide variety of different transistor types in combination with one another. By way of example, random access memory transistors, such as static random access memory (SRAM) or dynamic random access memory (DRAM) transistors, are in many configurations used in combination with a variety of logic transistors. A challenge, however, associated with integrating different transistors is that each type of transistor generally requires a threshold voltage ($V_t$) that is different from what the other types of transistors require. For example, with integrated circuit configurations that combine SRAM and logic transistors, the SRAM transistors typically require a higher $V_t$ than their logic counterparts. This $V_t$ difference is due to the relatively lower power requirements of SRAM transistors, i.e., as compared to logic transistors.

In conventional designs, these different $V_t$ requirements are addressed through doping. Specifically, extra doping steps are performed to alter the $V_t$ of the SRAM transistors relative to the logic transistors, and vice versa. This approach, however, has a notable drawback. Since the $V_t$ of the transistors is determined through doping, the doping must be consistent from one device to another to attain consistent $V_t$. Namely, dopant fluctuations, which can occur in a significant number of devices produced, leads to variability in the transistors. Variability in the transistors leads to variability in the devices and thus affects device performance. As device feature sizes are scaled, the effects of dopant fluctuations and device variability become even more pronounced.

Therefore, improved techniques for combining transistors having different $V_t$ requirements would be desirable.

SUMMARY OF THE INVENTION

The present invention provides techniques for combining transistors having different threshold voltage ($V_t$) requirements from one another. In one aspect of the invention, a semiconductor device is provided. The semiconductor device comprises a substrate having at least a first and a second n-channel field effect transistor (nFET) region, and at least a first and a second p-channel field effect transistor (pFET) region; at least one logic nFET on the substrate over the first nFET region; at least one logic pFET on the substrate over the first pFET region; at least one static random access memory (SRAM) nFET on the substrate over the second nFET region; and at least one SRAM pFET on the substrate over the second pFET region. Each of the logic nFET, logic pFET, SRAM nFET and SRAM pFET comprises a gate stack having a metal layer over a high-K layer. The logic nFET gate stack further comprises a capping layer separating the metal layer from the high-K layer, wherein the capping layer is further configured to shift a $V_t$ of the logic nFET relative to a $V_t$ of one or more of the logic pFET, SRAM nFET and SRAM pFET.

In another aspect of the invention, a method of fabricating a semiconductor device is provided. The method comprises the following steps. A substrate is provided having at least one logic nFET region, at least one SRAM nFET region, at least one logic pFET region and at least one SRAM pFET region. Crystalline silicon germanium is selectively formed in the logic pFET region. An interfacial layer dielectric is grown over the logic nFET region, the SRAM nFET region, the logic pFET region and the SRAM pFET region. A high-K layer is deposited over the interfacial layer dielectric. A capping layer is formed in the logic nFET region over a side of the high-K layer opposite the interfacial layer dielectric. A metal layer is deposited over the capping layer in the logic nFET region and over the high-K layer in the SRAM nFET region, the logic pFET region and the SRAM pFET region. A silicon layer is deposited over the metal layer. An etch is performed through the interfacial layer dielectric, the high-K layer, the capping layer, the metal layer and the silicon layer to form a logic nFET gate stack over the logic nFET region, and through the interfacial layer dielectric, the high-K layer, the metal layer and the silicon layer to form a SRAM nFET gate stack over the SRAM nFET region, a logic pFET gate stack over the logic pFET region and a SRAM pFET gate stack over the SRAM pFET region.

In yet another aspect of the invention, another method of fabricating a semiconductor device is provided. The method comprises the following steps. A substrate is provided having at least one logic nFET region, at least one SRAM nFET region, at least one logic pFET region and at least one SRAM pFET region. An interfacial layer dielectric is grown over the logic nFET region, the SRAM nFET region, the logic pFET region and the SRAM pFET region. A high-K layer is deposited over the interfacial layer dielectric. A capping layer is formed in the logic nFET region and the SRAM pFET region over a side of the high-K layer opposite the interfacial layer dielectric. A metal layer is deposited over the capping layer in the logic nFET region and the SRAM pFET region and over the high-K layer in the SRAM nFET region and the logic pFET region. A silicon layer is deposited over the metal layer. An etch is performed through the interfacial layer dielectric, the high-K layer, the capping layer, the metal layer and the silicon layer to form a logic nFET gate stack over the logic nFET region and a SRAM pFET gate stack over the SRAM pFET region, and through the interfacial layer dielectric, the high-K layer, the metal layer and the silicon layer to form a SRAM nFET gate stack over the SRAM nFET region and a logic pFET gate stack over the logic pFET region.

The method can further comprise the following steps. A tensile silicon nitride layer is deposited over the logic nFET region and the SRAM nFET region. The logic pFET region and the SRAM pFET region are oxidized. A compressive silicon nitride layer is deposited over the logic pFET region and the SRAM pFET region.

A more complete understanding of the present invention, as well as further features and advantages of the present invention, will be obtained by reference to the following detailed description and drawings.

BRIEF DESCRIPTION OF THE DRAWINGS

FIGS. 4A-L are cross-sectional diagrams illustrating still yet another exemplary methodology for forming an integrated SRAM-logic semiconductor device according to an embodiment of the present invention.

DETAILED DESCRIPTION OF PREFERRED EMBODIMENTS

FIGS. 1A-G are cross-sectional diagrams illustrating an exemplary methodology for forming an integrated static random access memory (SRAM)-logic semiconductor device. The device can comprise, for example, an integrated circuit having a plurality of SRAM and logic transistors.

With integrated SRAM-logic devices, it is desirable to be able to accurately and consistently alter the threshold voltage ($V_t$) of the SRAM transistors as compared to the $V_t$ of the logic transistors. For example, the SRAM transistors will likely require a higher $V_t$ than the logic transistors. As will be described in detail below, the present techniques involve transistors having high-K/metal gate stacks. A capping layer can be selectively employed in one or more of the gate stacks and/or crystalline silicon-germanium (cSiGe) can be selectively grown to alter the $V_t$ of the corresponding transistor(s).

Figure 1A:
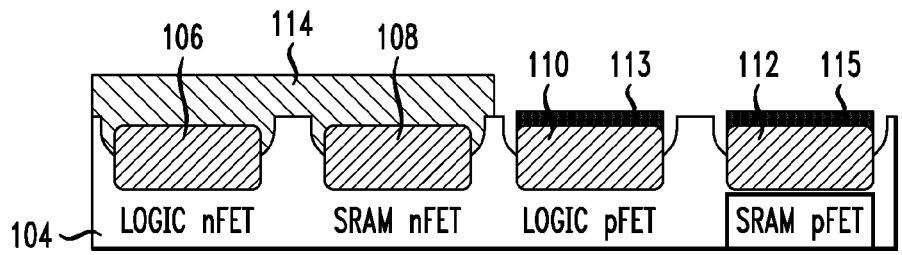
FIGS. 1A-G are cross-sectional diagrams illustrating an exemplary methodology for forming an integrated static random access memory (SRAM)-logic semiconductor device according to an embodiment of the present invention.

As shown in FIG. 1A, a substrate 104 is provided. Substrate 104 can comprise a silicon-on-insulator (SOI) substrate or a bulk silicon (Si) substrate. According to an exemplary embodiment, substrate 104 comprises a SOI substrate having a Si layer over an insulator (such as silicon dioxide ($SiO_2$)), wherein the Si layer has a thickness of between about five nanometers (nm) and about 100 nm.

Substrate 104 has both SRAM and logic n-channel field effect transistor (nFET) and p-channel field effect transistor (pFET) regions defined therein. Specifically, according to the exemplary embodiment shown illustrated in FIG. 1A, substrate 104 comprises logic nFET region 106, SRAM nFET region 108, logic pFET region 110 and SRAM pFET region 112. Each of logic nFET region 106 and SRAM nFET region 108 comprises Si and is doped with a p-type dopant. Each of logic pFET region 110 and SRAM pFET region 112 also comprises Si and is doped with an n-type dopant. As will be described below, cSiGe will be formed in each of logic pFET region 110 and SRAM pFET region 112. The cSiGe in SRAM pFET region 112 will have a reduced germanium (Ge) fraction. By way of example only, the cSiGe in SRAM pFET region 112 can have a Ge fraction of less than about 30 percent (%), preferably between about 15% and about 25%. By comparison, the cSiGe in logic PFET region 110 can have a Ge fraction of between about 30% and about 40%. The process for tuning the amount of Ge, i.e., during growth of the cSiGe, is known to those of skill in the art, and as such is not described further herein.

A hardmask layer is deposited over the device and patterned to form hardmask 114 over the nFET regions, i.e., over nFET region 106 and SRAM nFET region 108. With hardmask 114 shielding logic nFET region 106 and SRAM nFET region 108, cSiGe 113 and 115 are then selectively formed, i.e., grown, in logic pFET region 110 and SRAM pFET region 112, respectively. As described above, SRAM pFET region 112 has a reduced Ge fraction, e.g., as compared to logic pFET region 110. According to an exemplary embodiment, this variation between the two pFET regions is accomplished using a two-step masking process wherein a mask (not shown) is first placed over logic pFET region 110 and the cSiGe is formed in SRAM pFET region 112 having a reduced Ge fraction. The mask is removed and a second mask (not shown) is placed over SRAM pFET region 112 and the cSiGe is formed in logic pFET region 110. The second mask is then removed. This two-step masking process is performed with hardmask 114 in place. The sequence of this two-step masking process is not important, and can be performed wherein the cSiGe is first formed in logic pFET region 110, followed by the cSiGe having the reduced Ge fraction being formed in the SRAM pFET region 112.

Figure 1B:
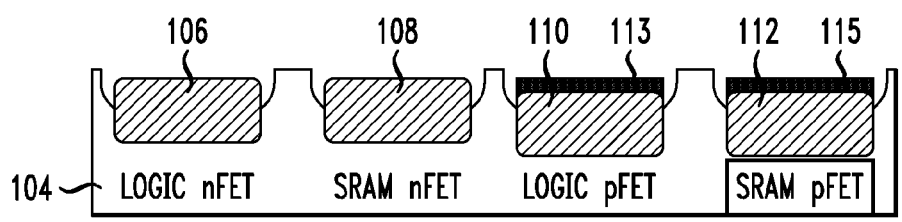

As shown in FIG. 1B, hardmask 114 is stripped. According to an exemplary embodiment, hardmask 114 is stripped using a wet chemical etch.

Figure 1C:
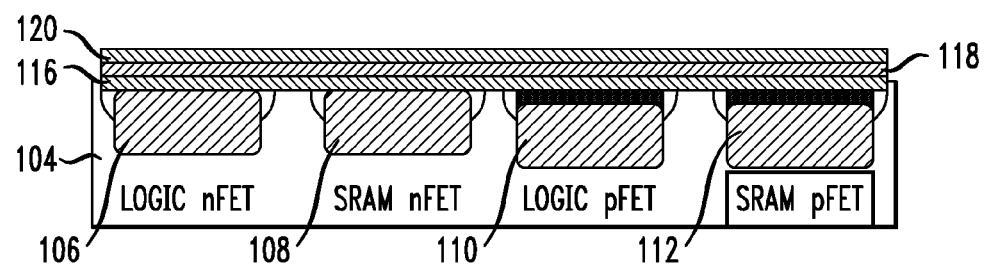

As shown in FIG. 1C, interfacial layer (IL) dielectric 116 is grown over the nFET/pFET regions. According to an exemplary embodiment, IL dielectric 116 comprises $SiO_2$. Nitrogen is then incorporated (e.g., by nitridation, thermal nitridation and/or plasma oxidation followed by nitridation) into IL dielectric 116. High-K layer 118 is then deposited over a side of IL dielectric 116 opposite the nFET/pFET regions. According to an exemplary embodiment, high-K layer 118 comprises one or more of hafnium oxide ($HfO_2$), zirconium oxide ($ZrO_2$), hafnium silicate (HfSiO), nitrided hafnium silicate (HfSiON), tantalum oxide ($Ta_2O_5$), titanium oxide ($TiO_2$), aluminum oxide ($Al_2O_3$) and mixtures comprising at least one of the foregoing high-K materials.

Capping layer 120 is deposited over a side of high-K layer 118 opposite IL dielectric 116. According to an exemplary embodiment, capping layer 120 comprises one or more of lanthanum oxide ($La_2O_3$), magnesium oxide (MgO), oxides of group IIA and group IIIB elements and nitrides of group IIA and group IIIB elements. Capping layers are described, for example, in U.S. Patent Application No. 2006/0289948 filed by Brown et al., entitled "Method to control flatband/threshold voltage in high-k metal gated stacks and structures thereof" and in U.S. Patent Application No. 2006/0244035 filed by Bojarczuk et al., entitled "Stabilization of flatband voltages and threshold voltages in hafnium oxide based silicon transistors for CMOS," the disclosures both of which are incorporated by reference herein. As will be described below, in the completed device, capping layer 120 can provide between about a 300 millivolt (mV) and about a 350 mV $V_t$ shift in the nFET. Further, reduced Ge fraction cSiGe can provide between about a 200 mV and about a 350 mV $V_t$ shift in the pFET.

Figure 1D:
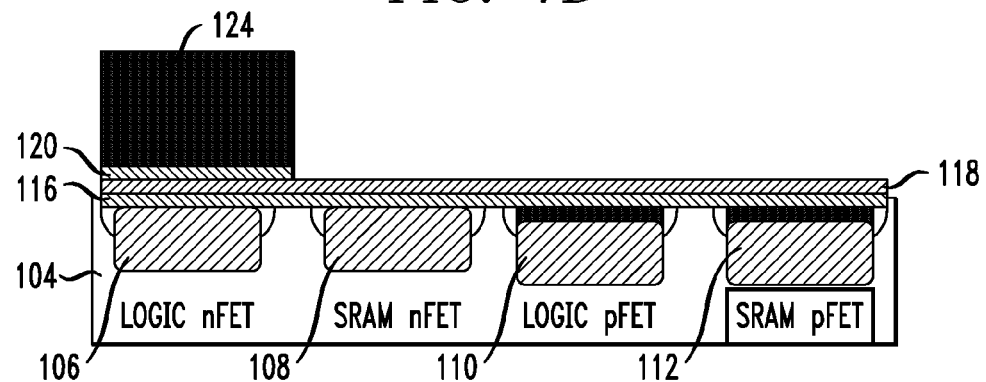

As shown in FIG. 1D, photoresist 124 is patterned over logic nFET region 106. With photoresist 124 as a mask, capping layer 120 is selectively removed, i.e., stripped, from over SRAM nFET region 108, logic pFET region 110 and SRAM pFET region 112. According to an exemplary embodiment, capping layer 120 is selectively removed from over SRAM nFET region 108, logic pFET region 110 and SRAM pFET region 112 using hydrochloric acid (HCl). For example, if high-K layer 118 comprises $HfO_2$ (as described above) and if capping layer 120 comprises $La_2O_3$ (as described above), HCl would be selective for the removal of the $La_2O_3$ layer from the $HfO_2$ layer. For different capping layer compositions, other suitable chemistries can be used for selectively removing the capping layer.

Figure 1E:
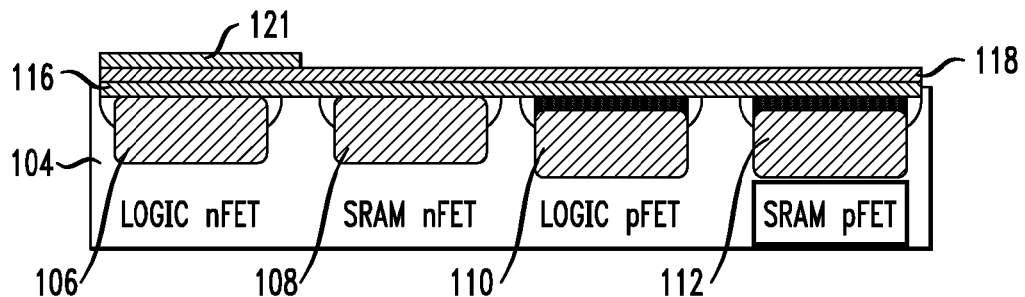
Figure 1F:
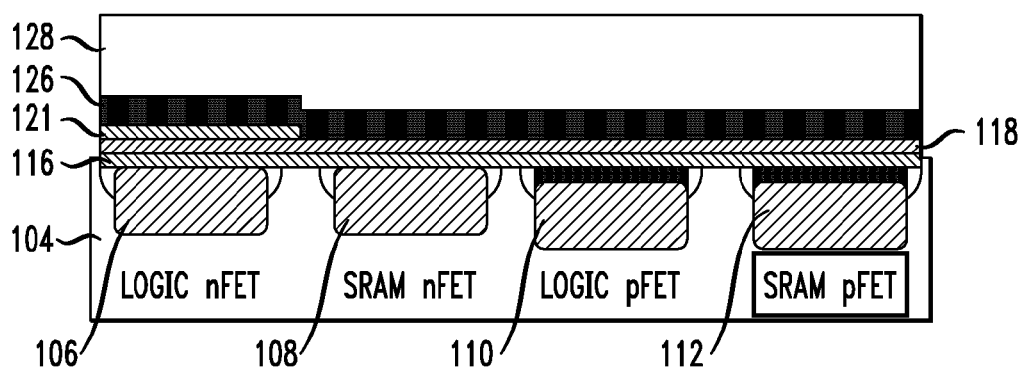

As shown in FIG. 1E, photoresist 124 is removed revealing the remaining portion of the capping layer formed over the logic nFET region, i.e., capping layer 121 over logic nFET region 106. As shown in FIG. 1F, metal layer 126 is deposited over capping layer 121/high-K layer 118. According to an exemplary embodiment, metal layer 126 comprises one or more of titanium nitride (TiN), tantalum nitride (TaN), tantalum aluminum nitride (TaAlN), titanium aluminum nitride (TiAlN), and tantalum carbide (TaC or $Ta_2C$).

A Si layer 128 is then deposited over a side of metal layer 126 opposite capping layer 121/high-K layer 118. According to an exemplary embodiment, Si layer 128 comprises polysilicon (poly-Si) and/or amorphous Si and is deposited to a thickness of about 1,000 angstroms (Å) at its thickest point. However, depending on the technology, the thickness of Si layer 128 can vary from between about 500 Å to about 1,000 Å at its thickest point.

Figure 1G:
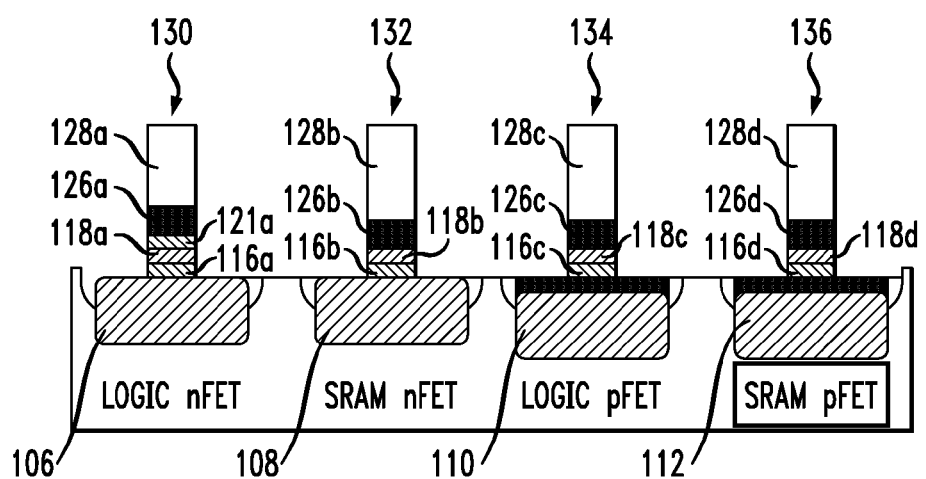

As shown in FIG. 1G, reactive ion etching (RIE) is then performed through the various layers to define individual gate stacks over each of the nFET and pFET regions. Namely, gate stack 130 is defined over logic nFET region 106. Gate stack 130 comprises IL dielectric 116a (formed from IL dielectric 116), high-K layer 118a (formed from high-K layer 118) over IL dielectric 116a, capping layer 121a (formed from capping layer 121) over a side of high-K layer 118a opposite IL dielectric 116a, metal layer 126a (formed from metal layer 126) over a side of capping layer 121 opposite high-K layer 118a and Si layer 128a (formed from Si layer 128) over a side of metal layer 126a opposite capping layer 121a.

Gate stack 132 is defined over SRAM nFET region 108. Gate stack 132 comprises IL dielectric 116b (formed from IL dielectric 116), high-K layer 118b (formed from high-K layer 118) over IL dielectric 116b, metal layer 126b (formed from metal layer 126) over a side of high-K layer 118b opposite IL dielectric 116b and Si layer 128b (formed from Si layer 128) over a side of metal layer 126b opposite high-K layer 118b.

Gate stack 134 is defined over logic pFET region 110. Gate stack 134 comprises IL dielectric 116c (formed from IL dielectric 116), high-K layer 118c (formed from high-K layer 118) over IL dielectric 116c, metal layer 126c (formed from metal layer 126) over a side of high-K layer 118c opposite IL dielectric 116c and Si layer 128c (formed from Si layer 128) over a side of metal layer 126c opposite high-K layer 118c.

Gate stack 136 is defined over SRAM pFET region 112. Gate stack 136 comprises IL dielectric 116d (formed from IL dielectric 116), high-K layer 118d (formed from high-K layer 118) over IL dielectric 116d, metal layer 126d (formed from metal layer 126) over a side of high-K layer 118d opposite IL dielectric 116d and Si layer 128d (formed from Si layer 128) over a side of metal layer 126d opposite high-K layer 118d.

Standard processes can then be carried out to form source and drain regions on opposite sides of the gate stacks. Oxide and/or nitride spacers can also be formed around the gate stack, as needed.

As a result of performing the steps shown illustrated in FIGS. 1A-G, and described above, the capping layer will be present only in gate stack 130. As such, the corresponding logic nFET will have a $V_t$ at band edge. The capping layer shifts the logic nFET $V_t$ by a combination of different processes. By way of example only, a) negative shifts in the $V_t$ may be due to positively charged mobile oxygen vacancies that form upon the aliovalent substitution of Hf4+ in $HfO_2$ with lower valence lanthanum cation (La3+) or magnesium cation (Mg2+) and are needed to compensate the negative effective charge of lanthanum hafnium (LaHf); b) the presence of a more electropositive impurity like lanthanum (La) or magnesium (Mg) in the $HfO_2$ could result in a dipole, which would shift the $V_t$ more negative (such a dipole would form as long as there is a non-symmetrical distribution in the La composition across the gate stack); and c) the interaction of La or Mg with the IL dielectric (e.g., $SiO_2$) can result in negative $V_t$ shifts by a combination of mechanisms a) and b).

By comparison, the SRAM nFET, which does not have a capping layer in its gate stack, i.e., gate stack 132, will have a $V_t$ that is about 200 mV greater than the $V_t$ of the logic nFET. For the pFETs, which also do not have a capping layer in their gate stacks, the $V_t$ is on target (i.e., at or near pFET band edge). Further, the presence of reduced Ge fraction cSiGe in the SRAM pFET (as described above) will provide a positive $V_t$ shift of between about a 200 mV and about a 350 mV in the SRAM pFET, as compared to the $V_t$ of the logic pFET. Thus, the use of reduced Ge fraction cSiGe to shift $V_t$ operates independently of the use of a capping layer to shift $V_t$. In general, the use of reduced Ge fraction cSiGe provides a positive $V_t$ shift, and the use of a capping layer provides a negative $V_t$ shift.

The above-described techniques are beneficial since they minimize the number of masking steps involved, which is favorable for reducing production time and costs. Other techniques, however, may be employed. For example, the same gate stack configurations can be obtained using a different masking process. Specifically, with reference to the step shown in FIG. 1C, a metal layer, e.g., a TiN layer, rather than the capping layer, is deposited over the high-k layer. A mask is then patterned to cover the metal layer over the SRAM nFET, logic pFET and SRAM pFET regions, allowing for the selective removal of the metal layer from over the logic nFET region. Following the removal of the metal layer from over the logic nFET region, the mask is also removed.

A capping layer is then deposited over the metal layer/high-K layer, followed by a second metal layer, e.g., a second TiN layer, being deposited over the capping layer. A second mask is then patterned to cover the second TiN layer over the logic nFET region, allowing for the selective removal of the second TiN and capping layers from over the SRAM nFET, logic pFET and SRAM pFET regions. Following the removal of the second TiN and capping layers from over the SRAM nFET, logic pFET and SRAM pFET regions, the mask is also removed. From this point on, the remainder of the process is the same as is illustrated in FIGS. 1F-G (described above).

Figure 2A:
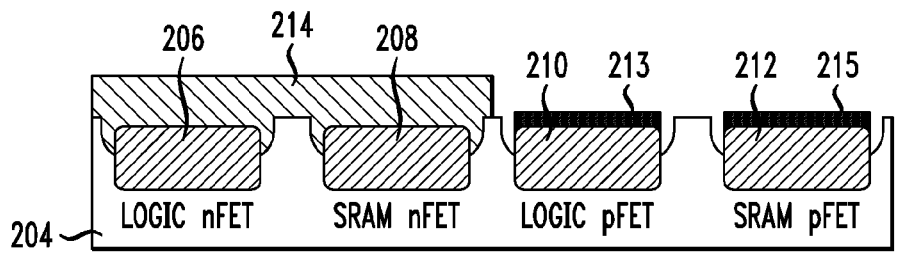
FIGS. 2A-G are cross-sectional diagrams illustrating another exemplary methodology for forming an integrated SRAM-logic semiconductor device according to an embodiment of the present invention.

FIGS. 2A-G are cross-sectional diagrams illustrating another exemplary methodology for forming an integrated SRAM-logic semiconductor device. The device can comprise, for example, an integrated circuit having a plurality of SRAM and logic transistors. As shown in FIG. 2A, a substrate 204 is provided. Substrate 204 can comprise a SOI substrate or a bulk Si substrate. According to an exemplary embodiment, substrate 204 comprises a SOI substrate having a Si layer over an insulator (such as $SiO_2$), wherein the Si layer has a thickness of between about five nm and about 100 nm.

Substrate 204 has both SRAM and logic nFET and pFET regions defined therein. Specifically, according to the exemplary embodiment shown illustrated in FIG. 2A, substrate 204 comprises logic nFET region 206, SRAM nFET region 208, logic pFET region 210 and SRAM pFET region 212. Each of logic nFET region 206 and SRAM nFET region 208 comprises Si and is doped with a p-type dopant. Each of logic pFET region 210 and SRAM pFET region 212 also comprises Si and is doped with an n-type dopant. As will be described below, cSiGe will be formed in each of logic pFET region 210 and SRAM pFET region 212.

Figure 2B:
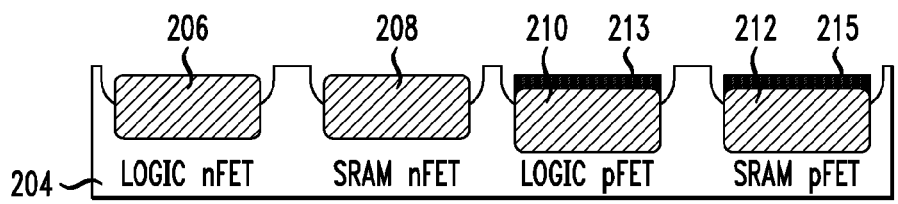

A hardmask layer is deposited over the device and patterned to form hardmask 214 over the nFET regions, i.e., over logic nFET region 206 and SRAM nFET region 208. With hardmask 214 shielding logic nFET region 206 and SRAM nFET region 208, cSiGe 213 and 215 are then selectively formed, i.e., grown, in logic pFET region 210 and SRAM pFET region 212, respectively. As shown in FIG. 2B, hardmask 214 is stripped. According to an exemplary embodiment, hardmask 214 is stripped using a wet chemical etch.

Figure 2C:
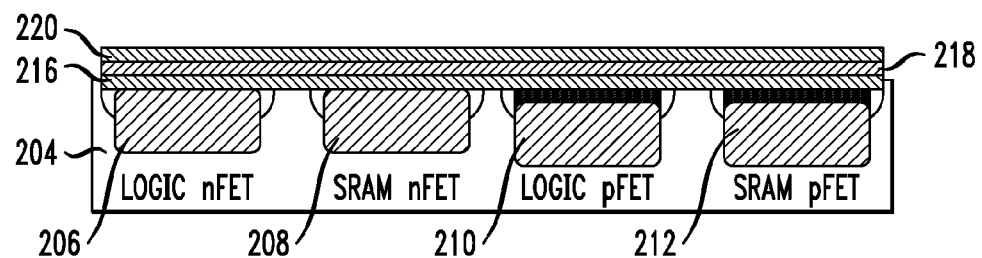

As shown in FIG. 2C, IL dielectric 216 is grown over the nFET/pFET regions. According to an exemplary embodiment, IL dielectric 216 comprises $SiO_2$. Nitrogen is then incorporated (e.g., by nitridation, thermal nitridation and/or plasma oxidation followed by nitridation) into IL dielectric 216. High-K layer 218 is then deposited over a side of IL dielectric 216 opposite the nFET/pFET regions. According to an exemplary embodiment, high-K layer 218 comprises one or more of $HfO_2$, $ZrO_2$, HfSiO, HfSiON, $Ta_2O_5$, $TiO_2$, $Al_2O_3$ and mixtures comprising at least one of the foregoing high-K materials. Capping layer 220 is deposited over a side of high-K layer 218 opposite IL dielectric 216. According to an exemplary embodiment, capping layer 220 comprises one or more of $La_2O_3$, MgO, oxides of group IIA and group IIIB elements and nitrides of group IIA and group IIIB elements.

Figure 2D:
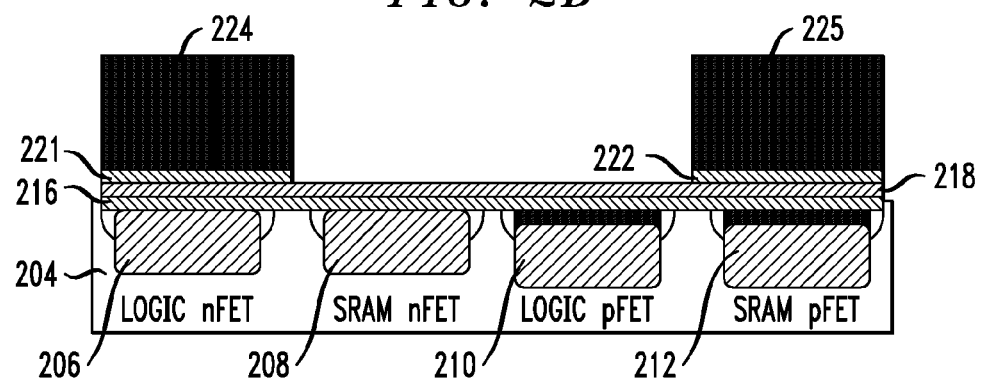

As shown in FIG. 2D, photoresist 224 and 225 are patterned over logic nFET region 206 and SRAM pFET region 212. With photoresist 224 and 225 as masks, capping layer 220 is selectively removed, i.e., stripped, from over SRAM nFET region 208 and logic pFET region 210. According to an exemplary embodiment, capping layer 220 is selectively removed from over SRAM nFET region 208 and logic pFET region 210 using HCl.

Figure 2E:
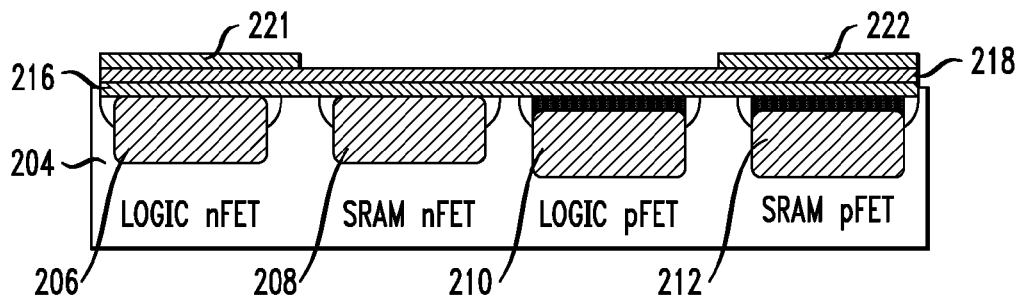
Figure 2F:
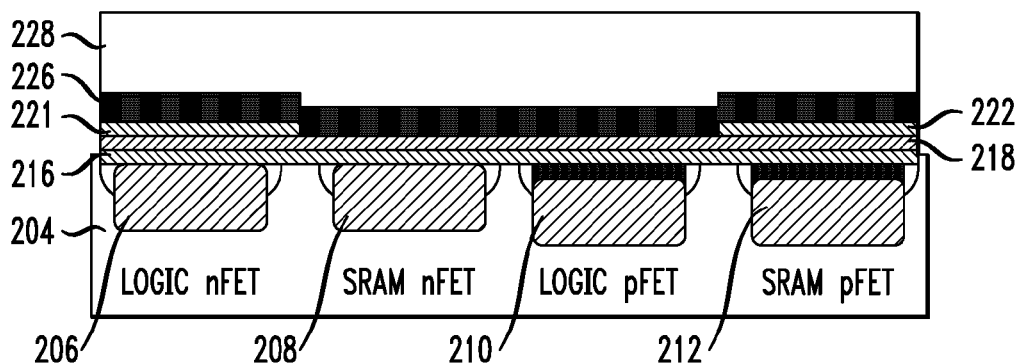

As shown in FIG. 2E, photoresist 224 and 225 are removed, revealing the remaining portions of the capping layer formed over the logic nFET and the SRAM pFET regions, i.e., capping layers 221 and 222 over logic NFET region 206 and SRAM pFET region 212, respectively. As shown in FIG. 2F, metal layer 226 is deposited over high-K layer 218/capping layer 221/capping layer 222. According to an exemplary embodiment, metal layer 226 comprises one or more of TiN, TaN, TaAlN, TiAlN, TaC and $Ta_2C$.

A Si layer 228 is then deposited over a side of metal layer 226 opposite high-K layer 218/capping layer 221/capping layer 222. According to an exemplary embodiment, Si layer 228 comprises poly-Si and/or amorphous Si and is deposited to a thickness of about 1,000 Å at its thickest point. However, depending on the technology, the thickness of Si layer 228 can vary from about 500 Å to about 1,000 Å at its thickest point.

Figure 2G:
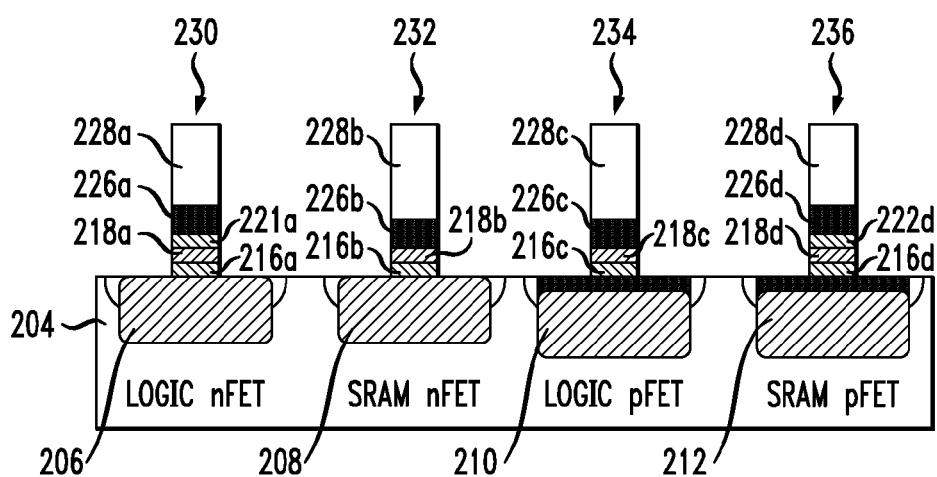

As shown in FIG. 2G, RIE is then performed through the various layers to define individual gate stacks over each of the nFET and pFET regions. Namely, gate stack 230 is defined over logic nFET region 206. Gate stack 230 comprises IL dielectric 216a (formed from IL dielectric 216), high-K layer 218a (formed from high-K layer 218) over IL dielectric 216a, capping layer 221a (formed from capping layer 221) over a side of high-K layer 218a opposite IL dielectric 216a, metal layer 226a (formed from metal layer 226) over a side of capping layer 221a opposite high-K layer 218a and Si layer 228a (formed from Si layer 228) over a side of metal layer 226a opposite capping layer 221a.

Gate stack 232 is defined over SRAM nFET region 208. Gate stack 232 comprises IL dielectric 216b (formed from IL dielectric 216), high-K layer 218b (formed from high-K layer 218) over IL dielectric 216b, metal layer 226b (formed from metal layer 226) over a side of high-K layer 218b opposite IL dielectric 216b and Si layer 228b (formed from Si layer 228) over a side of metal layer 226b opposite high-K layer 218b.

Gate stack 234 is defined over logic pFET region 210. Gate stack 234 comprises IL dielectric 216c (formed from IL dielectric 216), high-K layer 218c (formed from high-K layer 218) over IL dielectric 216c, metal layer 226c (formed from metal layer 226) over a side of high-K layer 218c opposite IL dielectric 216c and Si layer 228c (formed from Si layer 228) over a side of metal layer 226c opposite high-K layer 218c.

Gate stack 236 is defined over SRAM pFET region 212. Gate stack 236 comprises IL dielectric 216d (formed from IL dielectric 216), high-K layer 218d (formed from high-K layer 218) over IL dielectric 216d, capping layer 222d (formed from capping layer 222) over a side of high-K layer 218d opposite IL dielectric 216d, metal layer 226d (formed from metal layer 226) over a side of capping layer 222d opposite high-K layer 218d and Si layer 228d (formed from Si layer 228) over a side of metal layer 226d opposite capping layer 222d.

Standard processes can then be carried out to form source and drain regions on opposite sides of the gate stacks. Oxide and/or nitride spacers can also be formed around the gate stack, as needed.

As a result of performing the steps shown illustrated in FIGS. 2A-G, and described above, the capping layer will be present in gate stacks 230 and 236. By including the capping layer in gate stack 230, the corresponding logic nFET will have a $V_t$ at band edge. Conversely, by excluding the capping layer from gate stack 234, the corresponding logic pFET will also have a $V_t$ at band edge. The SRAM nFET, which does not have a capping layer in its gate stack, i.e., gate stack 232, will have a $V_t$ that is about 200 mV greater than the $V_t$ of the logic nFET. The SRAM pFET, which has a capping layer in its gate stack, i.e., gate stack 236, will have a $V_t$ that is about 250 mV greater than the $V_t$ of the logic pFET.

The above-described techniques are beneficial since they involve only a single masking step, which is favorable for reducing production time and costs. Other techniques, however, may be employed. For example, the same gate stack configurations can be obtained using a two-step masking process. Specifically, with reference to the step shown in FIG. 2C, a metal layer, e.g., a TiN layer, rather than the capping layer, is deposited over the high-k layer. A mask is then patterned to cover the metal layer over the SRAM nFET and logic pFET regions, allowing for the selective removal of the metal layer from over the logic nFET and SRAM pFET regions. Following the removal of the metal layer from over the logic nFET and SRAM pFET regions, the mask is also removed.

A capping layer is then deposited over the metal layer/high-K layer, followed by a second metal layer, e.g., a second TiN layer, being deposited over the capping layer. A second mask is then patterned to cover the second TiN layer over the logic nFET and SRAM pFET regions, allowing for the selective removal of the second TiN and capping layers from over the logic pFET and SRAM nFET regions. Following the removal of the second TiN and capping layers from over the logic pFET and SRAM nFET regions, the mask is also removed. From this point on, the remainder of the process is the same as is illustrated in FIGS. 2F-G (described above).

Figure 3A:
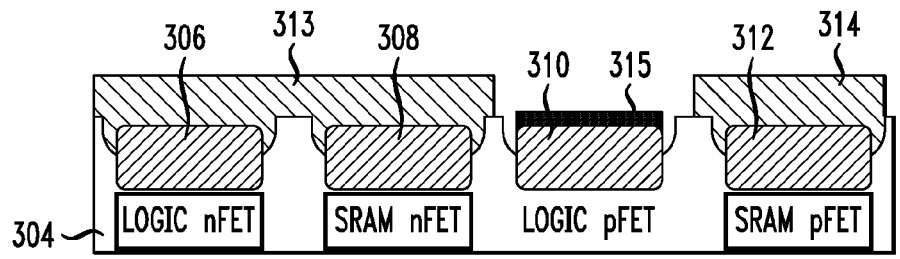
FIGS. 3A-G are cross-sectional diagrams illustrating yet another exemplary methodology for forming an integrated SRAM-logic semiconductor device according to an embodiment of the present invention.

FIGS. 3A-G are cross-sectional diagrams illustrating yet another exemplary methodology for forming an integrated SRAM-logic semiconductor device. The device can comprise, for example, an integrated circuit having a plurality of SRAM and logic transistors. As shown in FIG. 3A, a substrate 304 is provided. Substrate 304 can comprise a SOI substrate or a bulk Si substrate. According to an exemplary embodiment, substrate 304 comprises a SOI substrate having a Si layer over an insulator (such as $SiO_2$), wherein the Si layer has a thickness of between about five nm and about 100 nm.

Substrate 304 has both SRAM and logic nFET and pFET regions defined therein. Specifically, according to the exemplary embodiment shown illustrated in FIG. 3A, substrate 304 comprises logic nFET region 306, SRAM nFET region 308, logic pFET region 310 and SRAM pFET region 312. Each of logic nFET region 306 and SRAM nFET region 308 comprises Si and is doped with a p-type dopant. Each of logic pFET region 310 and SRAM pFET region 312 also comprises Si and is doped with an n-type dopant. As will be described below, cSiGe will be formed in logic pFET region 310.

Figure 3B:
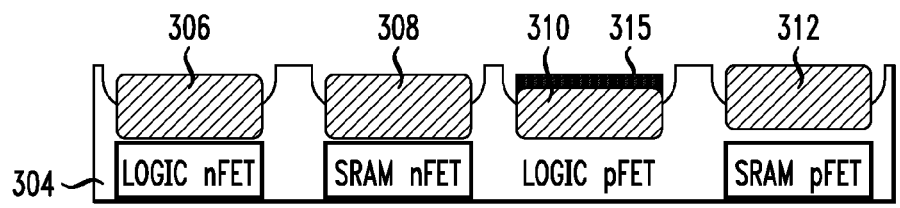

A hardmask layer is deposited over the device and patterned to form hardmasks 313 and 314 over logic nFET region 306/SRAM nFET region 308 and SRAM pFET region 312, respectively. With hardmask 313 shielding logic nFET region 306/SRAM nFET region 308 and hardmask 314 shielding SRAM pFET region 312, cSiGe 315 is then selectively formed, i.e., grown, in logic pFET region 310. As shown in FIG. 3B, hardmasks 313 and 314 are stripped. According to an exemplary embodiment, hardmask 313 and 314 are stripped using a wet chemical etch.

Figure 3C:
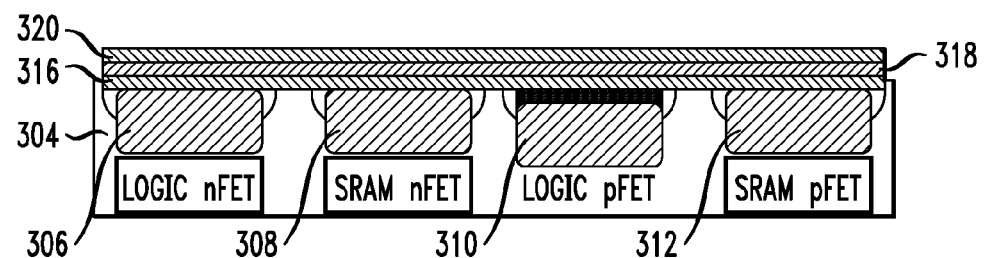

As shown in FIG. 3C, IL dielectric 316 is grown over the nFET/pFET regions. According to an exemplary embodiment, IL dielectric 316 comprises $SiO_2$. Nitrogen is then incorporated (e.g., by nitridation, thermal nitridation and/or plasma oxidation followed by nitridation) into IL dielectric 316. High-K layer 318 is then deposited over a side of IL dielectric 316 opposite the nFET/pFET regions. According to an exemplary embodiment, high-K layer 318 comprises one or more of $HfO_2$, $ZrO_2$, HfSiO, HfSiON, $Ta_2O_5$, $TiO_2$, $Al_2O_3$ and mixtures comprising at least one of the foregoing high-K materials.

Capping layer 320 is deposited over a side of high-K layer 318 opposite IL dielectric 316. According to an exemplary embodiment, capping layer 320 comprises one or more of $La_2O_3$, MgO, oxides of group IIA and group IIIB elements and nitrides of group IIA and group IIIB elements.

Figure 3D:
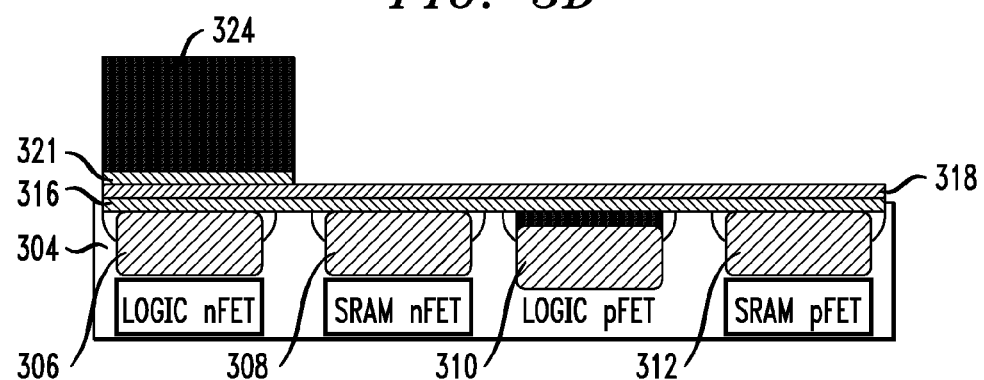

As shown in FIG. 3D, photoresist 324 is patterned over logic nFET region 306. With photoresist 324 as a mask, capping layer 320 is selectively removed, i.e., stripped, from over SRAM nFET region 308, logic pFET region 310 and SRAM pFET region 312. According to an exemplary embodiment, capping layer 320 is selectively removed from over SRAM nFET region 308, logic pFET region 310 and SRAM pFET region 312 using HCl.

Figure 3E:
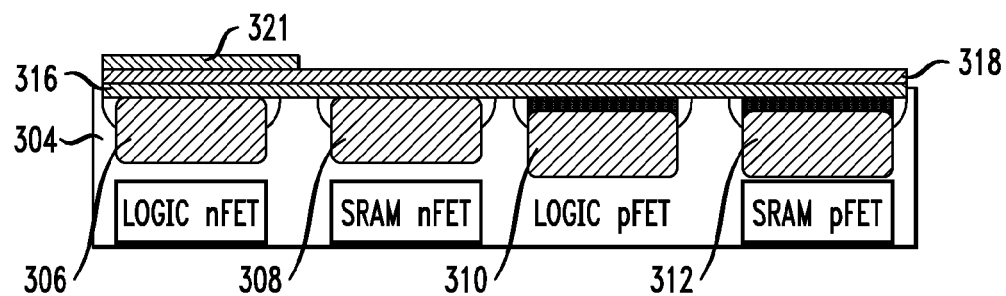
Figure 3F:
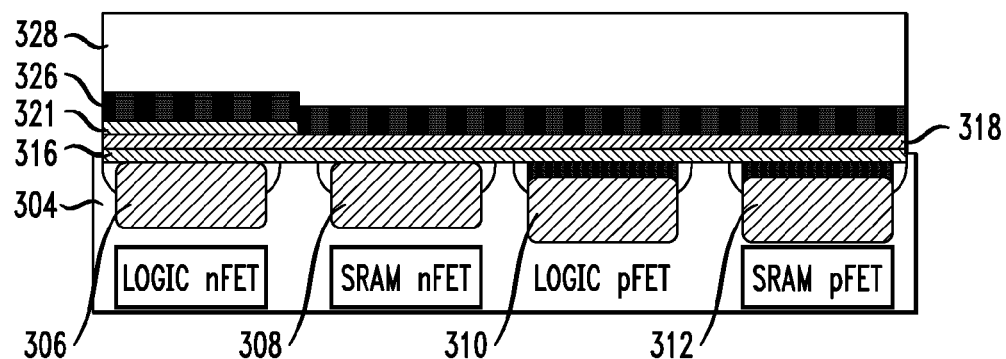

As shown in FIG. 3E, photoresist 324 is removed, revealing the remaining portion of the capping layer formed over the logic nFET region, i.e., capping layer 321 over logic nFET region 306. As shown in FIG. 3F, metal layer 326 is deposited over capping layer 321/high-K layer 318. According to an exemplary embodiment, metal layer 326 comprises one or more of TiN, TaN, TaAlN, TiAlN, TaC and $Ta_2C$ A Si layer 328 is then deposited over a side of metal layer 326 opposite capping layer 321/high-K layer 318. According to an exemplary embodiment, Si layer 328 comprises poly-Si and/or amorphous Si and is deposited to a thickness of about 1,000 Å at its thickest point. However, depending on the technology, the thickness of Si layer 328 can vary from about 500 Å to about 1,000 Å at its thickest point.

Figure 3G:
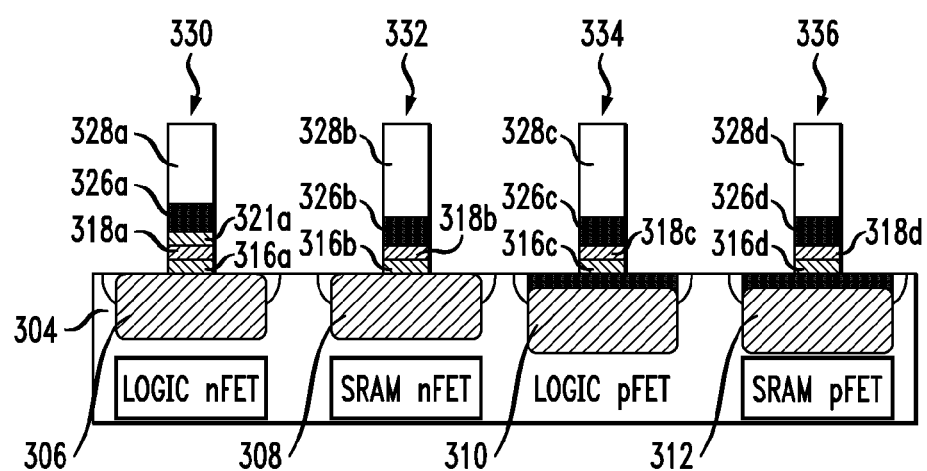

As shown in FIG. 3G, RIE is then performed through the various layers to define individual gate stacks over each of the nFET and pFET regions. Namely, gate stack 330 is defined over logic nFET region 306. Gate stack 330 comprises IL dielectric 316a (formed from IL dielectric 316), high-K layer 318a (formed from high-K layer 318) over IL dielectric 316a, capping layer 321a (formed from capping layer 321) over a side of high-K layer 318a opposite IL dielectric 316a, metal layer 326a (formed from metal layer 326) over a side of capping layer 321a opposite high-K layer 318a and Si layer 328a (formed from Si layer 328) over a side of metal layer 326a opposite capping layer 321a.

Gate stack 332 is defined over SRAM nFET region 308. Gate stack 332 comprises IL dielectric 316b (formed from IL dielectric 316), high-K layer 318b (formed from high-K layer 318) over IL dielectric 316b, metal layer 326b (formed from metal layer 326) over a side of high-K layer 318b opposite IL dielectric 316b and Si layer 328b (formed from Si layer 328) over a side of metal layer 326b opposite high-K layer 318b.

Gate stack 334 is defined over logic pFET region 310. Gate stack 334 comprises IL dielectric 316c (formed from IL dielectric 316), high-K layer 318c (formed from high-K layer 318) over IL dielectric 316c, metal layer 326c (formed from metal layer 326) over a side of high-K layer 318c opposite IL dielectric 316c and Si layer 328c (formed from Si layer 328) over a side of metal layer 326c opposite high-K layer 318c.

Gate stack 336 is defined over SRAM pFET region 312. Gate stack 336 comprises IL dielectric 316d (formed from IL dielectric 316), high-K layer 318d (formed from high-K layer 318) over IL dielectric 316d, metal layer 326d (formed from metal layer 326) over a side of high-K layer 318d opposite IL dielectric 316d and Si layer 328d (formed from Si layer 328) over a side of metal layer 326d opposite high-K layer 318d.

Standard processes can then be carried out to form source and drain regions on opposite sides of the gate stacks. Oxide and/or nitride spacers can also be formed around the gate stack, as needed.

As a result of performing the steps shown illustrated in FIGS. 3A-G, and described above, the capping layer will be present only in gate stack 330. By including the capping layer in gate stack 330, the corresponding logic NFET transistor will have a $V_t$ at band edge. Conversely, by excluding the capping layer from gate stack 334, the corresponding logic pFET transistor will also have a $V_t$ at band edge. The SRAM nFET transistor, which does not have a capping layer in its gate stack, i.e., gate stack 332, will have a $V_t$ that is about 200 mV greater than the $V_t$ of the logic nFET transistor. The SRAM pFET transistor, which also does not have a capping layer in its gate stack, i.e., gate stack 336, will have a $V_t$ that is about 500 mV greater than the $V_t$ of the logic pFET transistor.

The above-described techniques are beneficial since they involve only a single masking step, which is favorable for reducing production time and costs. Other techniques, however, may be employed. For example, the same gate stack configurations can be obtained using a two-step masking process. Specifically, with reference to the step shown in FIG. 3C, a metal layer, e.g., a TiN layer, rather than the capping layer, is deposited over the high-k layer. A mask is then patterned to cover the metal layer over the SRAM nFET, logic pFET and SRAM pFET regions, allowing for the selective removal of the metal layer from over the logic nFET region. Following the removal of the metal layer from over the logic nFET region, the mask is also removed.

A capping layer is then deposited over the metal layer/high-K layer, followed by a second metal layer, e.g., a second TiN layer, being deposited over the capping layer. A second mask is then patterned to cover the second TiN layer over the logic nFET region, allowing for the selective removal of the second TiN and capping layers from over the SRAM nFET, logic pFET and SRAM pFET regions. Following the removal of the second TiN and capping layers from over the SRAM nFET, logic pFET and SRAM pFET regions, the mask is also removed. From this point on, the remainder of the process is the same as is illustrated in FIGS. 3F-G (described above).

Figure 4A:
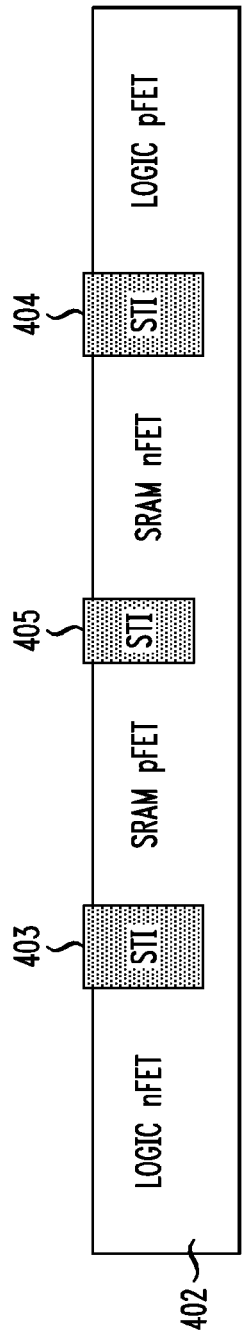

FIGS. 4A-L are cross-sectional diagrams illustrating still yet another exemplary methodology for forming an integrated SRAM-logic semiconductor device. The device can comprise, for example, an integrated circuit having a plurality of SRAM and logic transistors. As shown in FIG. 4A, a substrate 402 is provided. Substrate 402 can comprise a SOI substrate or a bulk Si substrate. According to an exemplary embodiment, substrate 402 comprises a SOI substrate having a Si layer over an insulator (such as $SiO_2$), wherein the Si layer has a thickness of between about five nm and about 100 nm. Substrate 402 has shallow trench isolation (STI) regions 403, 404 and 405 defined therein. As will be described in detail below, STI regions 403, 404 and 405 will serve to divide, and thereby define, nFET and pFET regions of the device. Namely, a region of the device shown to the left of STI region 403 will be a logic nFET region of the device, and a region of the device shown to the right of STI region 403 will be a SRAM pFET region of the device. A region of the device shown to the left of STI region 404 will be a SRAM nFET region of the device, and a region of the device shown to the right of STI region 404 will be a logic pFET region of the device. STI region 405 separates the SRAM pFET region of the device from the SRAM nFET region of the device.

Figure 4B:
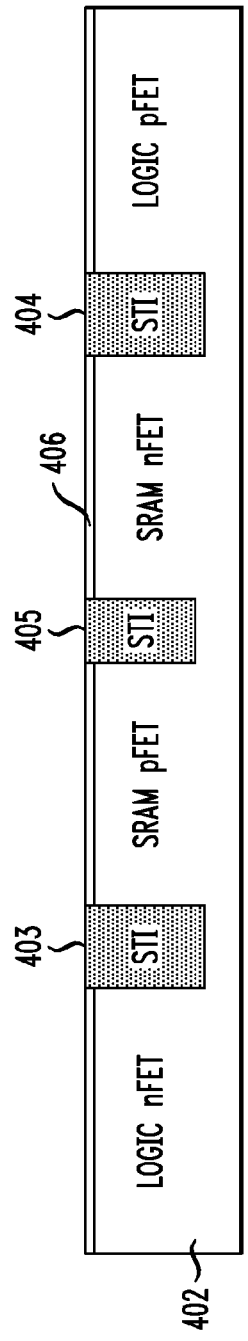
Figure 4C:
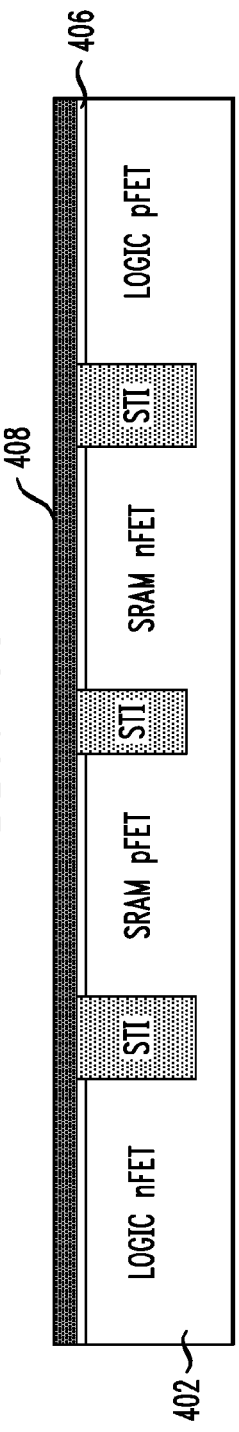

As shown in FIG. 4B, IL dielectric 406 is grown over the nFET and pFET regions. IL dielectric 406 is separated by STI regions 403, 404 and 405. As shown in FIG. 4C, high-K layer 408 is deposited over IL dielectric 406/STI region 403/STI region 404/STI region 405. According to an exemplary embodiment, high-K layer 408 comprises one or more of $HfO_2$, $ZrO_2$, HfSiO, HfSiON, $Ta_2O_5$, $TiO_2$, $Al_2O_3$ and mixtures comprising at least one of the foregoing high-K materials.

A capping layer is then deposited over a side of high-K layer 408 opposite IL dielectric 406/STI region 403/STI region 404/STI region 405. The capping layer can comprise one or more of $La_2O_3$, MgO, oxides of group IIA and group IIIB elements and nitrides of group IIA and group IIIB elements. The capping layer is then selectively removed from over the SRAM nFET/logic pFET regions to form capping layer 410 over the logic nFET/SRAM pFET regions, as shown in FIG. 4D. According to an exemplary embodiment, the capping layer is selectively removed from over the SRAM nFET/logic pFET regions using HCl.

As shown in FIG. 4E, metal layer 412, is deposited over capping layer 410/high-K layer 408. According to an exemplary embodiment, metal layer 412 comprises one or more of TiN, TaN, TaAlN, TiAlN, TaC and $Ta_2C$. As shown in FIG. 4F, a Si layer, i.e., Si layer 414, is deposited over metal layer 412. According to an exemplary embodiment, Si layer 414 comprises poly-Si or amorphous Si.

Figures 4G, 4H:
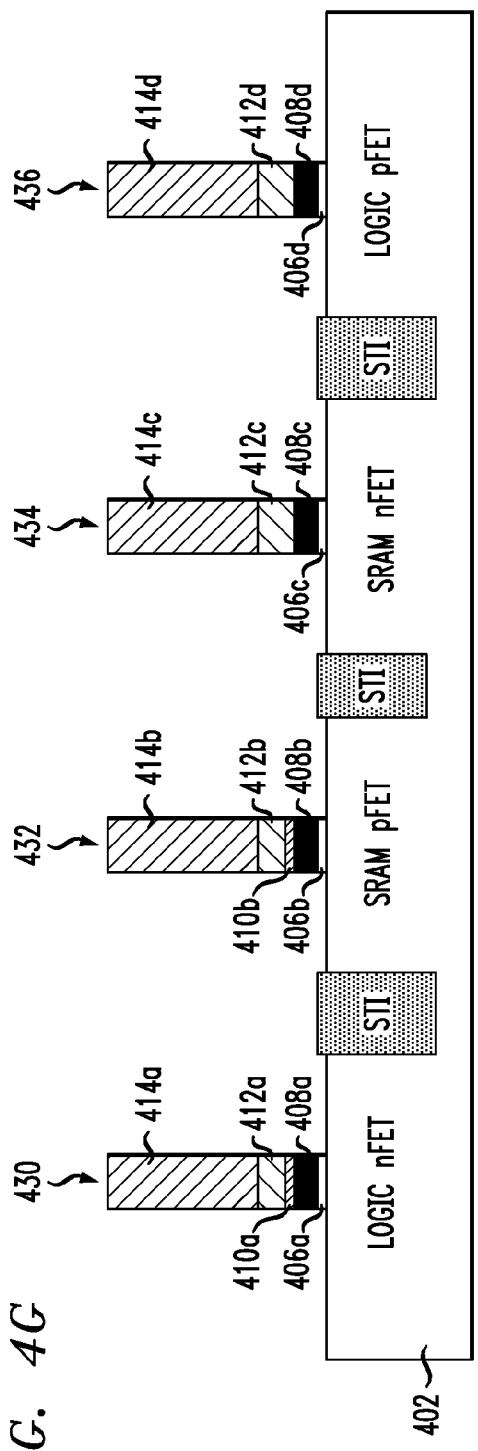

As shown in FIG. 4G, RIE is then performed through the various layers to define individual gate stacks over each of the nFET and pFET regions. Namely, gate stack 430 is defined over the logic nFET region. Gate stack 430 comprises IL dielectric 406a (formed from IL dielectric 406), high-K layer 408a (formed from high-K layer 408) over IL dielectric 406a, capping layer 410a (formed from capping layer 410) over a side of high-K layer 408a opposite IL dielectric 406a, metal layer 412a (formed from metal layer 412) over a side of capping layer 410a opposite high-K layer 408a and Si layer 414a (formed from Si layer 414) over a side of metal layer 412a opposite capping layer 410a.

Gate stack 432 is defined over the SRAM pFET region. Gate stack 432 comprises IL dielectric 406b (formed from IL dielectric 406), high-K layer 408b (formed from high-K layer 408) over IL dielectric 406b, capping layer 410b (formed from capping layer 410) over a side of high-K layer 408b opposite IL dielectric 406b, metal layer 412b (formed from metal layer 412) over a side of capping layer 410b opposite high-K layer 408b and Si layer 414b (formed from Si layer 414) over a side of metal layer 412b opposite capping layer 410b.

Gate stack 434 is defined over the SRAM nFET region. Gate stack 434 comprises IL dielectric 406c (formed from IL dielectric 406), high-K layer 408c (formed from high-K layer 408) over IL dielectric 406c, metal layer 412c (formed from metal layer 412) over a side of high-K layer 408c opposite IL dielectric 406c and Si layer 414c (formed from Si layer 414) over a side of metal layer 412c opposite high-K layer 408c.

Gate stack 436 is defined over the logic pFET region. Gate stack 436 comprises IL dielectric 406d (formed from IL dielectric 406), high-K layer 408d (formed from high-K layer 408) over IL dielectric 406d, metal layer 412d (formed from metal layer 412) over a side of high-K layer 408d opposite IL dielectric 406d and Si layer 414d (formed from Si layer 414) over a side of metal layer 412d opposite high-K layer 408d.

As shown in FIG. 4H, a combination of spacers is formed adjacent to each of the gate stacks. Namely, with regard to the logic nFET region, nitride spacers 440a are formed adjacent to gate stack 430, oxide spacers 442a are then formed adjacent to nitride spacers 440a and nitride spacers 444a are formed adjacent to oxide spacers 442a. With regard to the SRAM pFET region, nitride spacers 440b are formed adjacent to gate stack 432, oxide spacers 442b are then formed adjacent to nitride spacers 440b and nitride spacers 444b are formed adjacent to oxide spacers 442b. With regard to the SRAM nFET region, nitride spacers 440c are formed adjacent to gate stack 434, oxide spacers 442c are then formed adjacent to nitride spacers 440c and nitride spacers 444c are formed adjacent to oxide spacers 442c. With regard to the logic pFET region, nitride spacers 440d are formed adjacent to gate stack 436, oxide spacers 442d are then formed adjacent to nitride spacers 440d and nitride spacers 444d are formed adjacent to oxide spacers 442d.

Source/drain diffusions are formed in each of the nFET and pFET regions. Namely, source/drain diffusions 446a and 448a are formed in the logic nFET region, source/drain diffusions 446b and 448b are formed in the SRAM pFET region, source/drain diffusions 446c and 448c are formed in the SRAM nFET region and source/drain diffusions 446d and 448d are formed in the logic pFET region.

Exposed Si areas in each of the nFET and pFET regions are then silicided. As a result, silicide regions 450a are formed in the exposed Si areas of the logic nFET region, i.e., at gate stack 430 and source/drain diffusions 446a and 448a. Silicide regions 450b are formed in the exposed Si areas of the SRAM pFET region, i.e., at gate stack 432 and source/drain diffusions 446b and 448b. Silicide regions 450c are formed in the exposed Si areas of the SRAM nFET region, i.e., at gate stack 434 and source/drain diffusions 446c and 448c. Silicide regions 450d are formed in the exposed Si areas of the logic pFET region, i.e., at gate stack 436 and source/drain diffusions 446d and 448d.

Figure 4I:
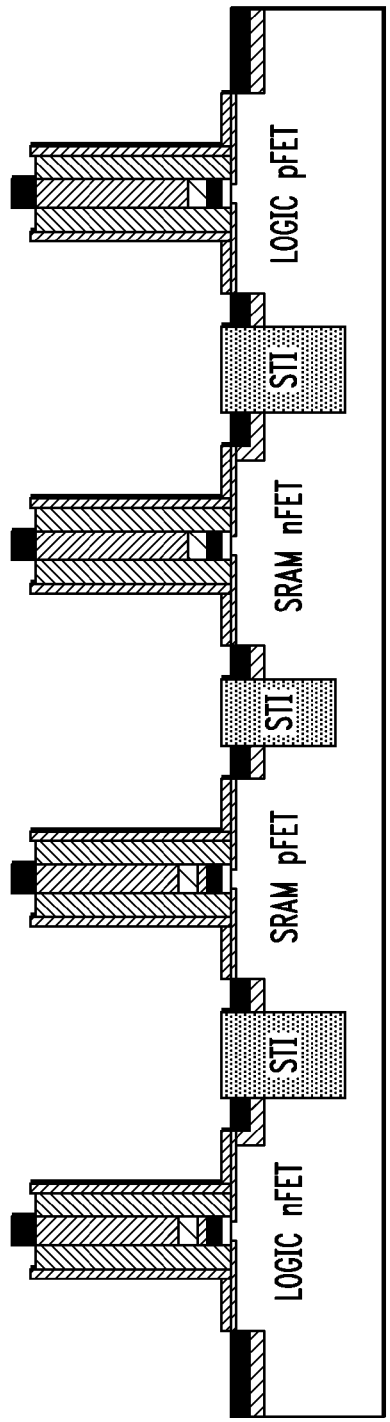
Figure 4J:
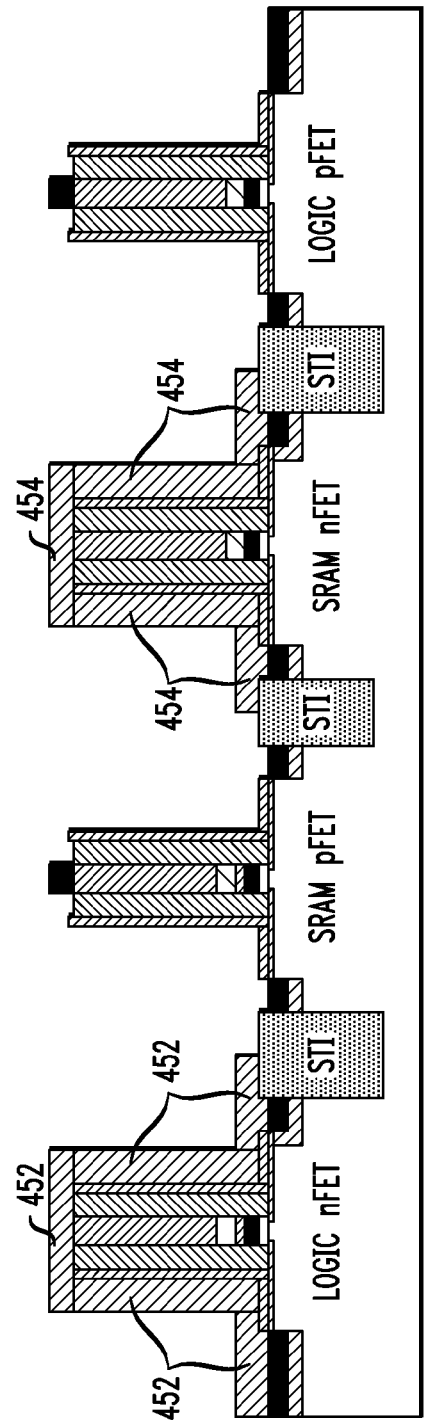

Following silicidation, the nitride spacers are removed from each of the nFET and pFET regions, as shown in FIG. 4I. As shown in FIG. 4J, a tensile silicon nitride (SiN) layer is deposited over the nFET regions. Namely, SiN layer 452 is deposited over the logic nFET region and SiN layer 454 is deposited over the SRAM nFET region. The tensile SiN layers, in combination with a compressive SiN layer (described below), form a dual stressed liner over the device. The tensile SiN layers further shield the nFET regions during a subsequent oxidation process of the pFET regions (see below).

As shown in FIG. 4K, oxidation is used to obtain a band-edge shift in the pFET regions. The term "band-edge shift," as used herein, refers to neutralizing positively charged oxygen vacancies by exposing the high-K layer, i.e., which as described above can be hafnium (Hf)-based, to oxygen ($O_2$) (e.g., as indicated by arrows 455). The elimination of this positive charge provides a positive shift in the $V_t$ such that the $V_t$ is closer to the ideal pFET band-edge position, which is desirable.

As shown in FIG. 4L, a compressive SiN layer is deposited over the pFET regions. Namely, SiN layer 456 is deposited over the SRAM pFET region and SiN layer 458 is deposited over the logic pFET region. As highlighted above, the tensile SiN layers, in combination with the compressive SiN layers, form a dual stressed liner over the device.

Figure 5:
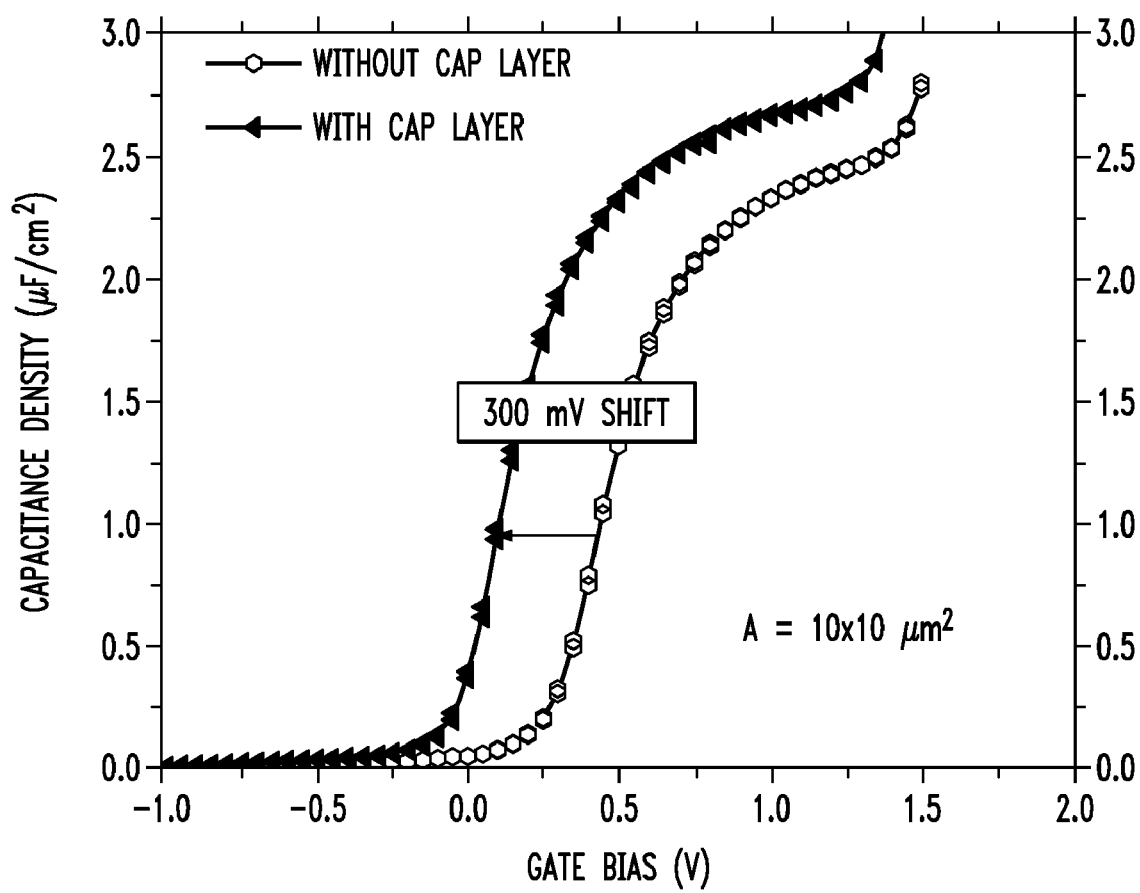
FIG. 5 is a graph illustrating a flat band voltage ($V_{fb}$) shift in an n-channel metal-oxide semiconductor capacitor (nMOSCAP) having a high-K/metal gate stack with a capping layer according to an embodiment of the present invention.

FIG. 5 is graph 500 illustrating a flat band voltage ($V_{fb}$) shift in an n-channel metal-oxide semiconductor capacitor (nMOSCAP) having a high-K/metal gate stack with a, i.e., $La_2O_3$, capping layer versus a nMOSCAP having a high-K/metal gate stack without a capping layer. Both nMOSCAP gate stacks were exposed to a 1,000 degrees Celsius (° C.), five second activation anneal. Graph 500 plots gate bias (measured in volts (V)) versus capacitance density (measured in microfarad per square centimeter ($\mu F/cm^2$). An area A of the capacitor is 10×10 square micrometers ($\mu m^2$).

Although illustrative embodiments of the present invention have been described herein, it is to be understood that the invention is not limited to those precise embodiments, and that various other changes and modifications may be made by one skilled in the art without departing from the scope of the invention.

The invention claimed is:

1. A method of fabricating a semiconductor device, comprising the steps of:
providing a substrate having at least one logic nFET region, at least one SRAM nFET region, at least one logic pFET region and at least one SRAM pFET region;
selectively forming crystalline silicon germanium in the logic pFET region;
growing an interfacial layer dielectric over the logic nFET region, the SRAM nFET region, the logic pFET region and the SRAM pFET region;
depositing a high-K layer over the interfacial layer dielectric;
forming a capping layer in the logic nFET region over a side of the high-K layer opposite the interfacial layer dielectric;
depositing a metal layer over the capping layer in the logic nFET region and over the high-K layer in the SRAM nFET region, the logic pFET region and the SRAM pFET region;
depositing a silicon layer over the metal layer;
performing an etch through the interfacial layer dielectric, the high-K layer, the capping layer, the metal layer and the silicon layer to form a logic nFET gate stack over the logic nFET region, and through the interfacial layer dielectric, the high-K layer, the metal layer and the silicon layer to form a SRAM nFET gate stack over the SRAM nFET region, a logic pFET gate stack over the logic pFET region and a SRAM pFET gate stack over the SRAM pFET region.

2. The method of claim 1, further comprising the step of:
selectively forming crystalline silicon germanium in the SRAM pFET region.

3. A method of fabricating a semiconductor device, comprising the steps of:
providing a substrate having at least one logic nFET region, at least one SRAM nFET region, at least one logic pFET region and at least one SRAM pFET region;
growing an interfacial layer dielectric over the logic nFET region, the SRAM nFET region, the logic pFET region and the SRAM pFET region;
depositing a high-K layer over the interfacial layer dielectric;
forming a capping layer in the logic nFET region and the SRAM pFET region over a side of the high-K layer opposite the interfacial layer dielectric;
depositing a metal layer over the capping layer in the logic nFET region and the SRAM pFET region and over the high-K layer in the SRAM nFET region and the logic pFET region;
depositing a silicon layer over the metal layer;
performing an etch through the interfacial layer dielectric, the high-K layer, the capping layer, the metal layer and the silicon layer to form a logic nFET gate stack over the logic nFET region and a SRAM pFET gate stack over the SRAM pFET region, and through the interfacial layer dielectric, the high-K layer, the metal layer and the silicon layer to form a SRAM nFET gate stack over the SRAM nFET region and a logic pFET gate stack over the logic pFET region.

4. The method of claim 3, further comprising the step of:
selectively forming crystalline silicon germanium in the logic pFET and SRAM pFET regions.

5. The method of claim 3, further comprising the steps of:
depositing a tensile silicon nitride layer over the logic nFET region and the SRAM nFET region;
oxidizing the logic pFET region and the SRAM pFET region; and
depositing a compressive silicon nitride layer over the logic pFET region and the SRAM pFET region.

* * * * *